(12) United States Patent
Lee

(10) Patent No.: US 10,680,210 B2
(45) Date of Patent: Jun. 9, 2020

(54) DISPLAY APPARATUS

(71) Applicant: LG Display Co., Ltd., Seoul (KR)

(72) Inventor: Moonsun Lee, Osan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/195,288

(22) Filed: Nov. 19, 2018

(65) Prior Publication Data

US 2019/0165300 A1    May 30, 2019

(30) Foreign Application Priority Data

Nov. 30, 2017   (KR) .................... 10-2017-0162884

(51) Int. Cl.
  *H05K 5/00*    (2006.01)
  *H01L 51/52*   (2006.01)
  *H01L 51/00*   (2006.01)
  *H01L 27/32*   (2006.01)

(52) U.S. Cl.
  CPC ........ *H01L 51/529* (2013.01); *H01L 51/0097* (2013.01); *H01L 51/5237* (2013.01); *H01L 51/5243* (2013.01); *H01L 51/5253* (2013.01); *H05K 5/0017* (2013.01); *H01L 27/3244* (2013.01); *H01L 2251/5338* (2013.01)

(58) Field of Classification Search
  None
  See application file for complete search history.

(56) References Cited

U.S. PATENT DOCUMENTS

| | | | |
|---|---|---|---|
| 9,146,590 B2* | 9/2015 | Myers | G06F 1/1633 |
| 9,189,016 B2* | 11/2015 | Jang | G06F 1/1652 |
| 9,323,292 B2* | 4/2016 | Bae | G06F 1/1656 |
| 9,568,800 B1 | 2/2017 | Sprague | |
| 9,818,974 B2 | 11/2017 | Kwon et al. | |
| 10,061,356 B2 | 8/2018 | Jin et al. | |
| 10,269,883 B2 | 4/2019 | Hatano et al. | |
| 2001/0002145 A1 | 5/2001 | Lee et al. | |
| 2003/0098642 A1 | 5/2003 | Tajima | |
| 2009/0257207 A1* | 10/2009 | Wang | G06F 1/1626 361/752 |

(Continued)

FOREIGN PATENT DOCUMENTS

| | | |
|---|---|---|
| EP | 3 079 033 A1 | 10/2016 |
| JP | 2001-201733 A | 7/2001 |

(Continued)

OTHER PUBLICATIONS

Japan Patent Office, Notice of Reasons for Refusal, JP Patent Application No. 2018-219857, dated Oct. 3, 2019, ten pages.

(Continued)

*Primary Examiner* — Courtney L Smith
*Assistant Examiner* — Rashen E Morrison
(74) *Attorney, Agent, or Firm* — Fenwick & West LLP

(57) ABSTRACT

A display apparatus may solve roughness and heat dissipation of a display panel. The display apparatus comprises a display panel which includes a first display portion and a second display portion bent from the first display portion, a support plate coupled to a rear surface of the first display portion, and a housing for receiving the support plate, the housing coupled with a rear surface of the second display portion.

17 Claims, 5 Drawing Sheets

(56) References Cited

U.S. PATENT DOCUMENTS

| | | | |
|---|---|---|---|
| 2013/0002133 A1* | 1/2013 | Jin | H01L 51/524 |
| | | | 313/511 |
| 2013/0279088 A1 | 10/2013 | Raff et al. | |
| 2014/0132488 A1* | 5/2014 | Kim | G06F 1/1652 |
| | | | 345/76 |
| 2014/0217382 A1 | 8/2014 | Kwon et al. | |
| 2014/0306941 A1 | 10/2014 | Kim et al. | |
| 2014/0320762 A1* | 10/2014 | Jeong | G06F 3/041 |
| | | | 349/12 |
| 2015/0331451 A1* | 11/2015 | Shin | G06F 3/041 |
| | | | 345/173 |
| 2016/0299527 A1* | 10/2016 | Kwak | H04M 1/0266 |
| 2016/0307973 A1 | 10/2016 | Yang et al. | |
| 2017/0145725 A1* | 5/2017 | Siddiqui | E05F 3/20 |
| 2018/0088736 A1* | 3/2018 | Jeong | H01L 27/323 |

FOREIGN PATENT DOCUMENTS

| | | |
|---|---|---|
| JP | 2003-228295 A | 8/2003 |
| JP | 2010-153813 A | 7/2010 |
| JP | 2013-015836 A | 1/2013 |
| KR | 10-2014-0118676 A | 10/2014 |
| TW | 201440582 A | 10/2014 |
| TW | 201638909 A | 11/2016 |

OTHER PUBLICATIONS

Taiwan Intellectual Property Office, Office Action, TW Patent Application No. 107139204, dated Feb. 18, 2020, 12 pages.

* cited by examiner

DISPLAY APPARATUS

CROSS-REFERENCE TO RELATED APPLICATIONS

This application claims the benefit of the Republic of Korea Patent Application No. 10-2017-0162884 filed on Nov. 30, 2017, which is hereby incorporated by reference in its entirety.

BACKGROUND

Technical Field

The present disclosure relates to a display apparatus.

Description of the Related Art

With the advancement of the information age, a demand for a display device for displaying an image has been increased in various forms. Recently, a display device of a slimmer size has been launched. Among display devices, a flexible display device has many advantages in that it is easy to carry it and may be applied to various shaped devices.

Since the flexible display device includes a bending area that may fold a substrate and may reduce a bezel size by folding the substrate at the bending area, a display device having a narrow bezel may be realized.

The flexible display device includes a flexible display panel. In this case, since the display panel is made of a material which is thin and has good flexibility, a problem occurs in that roughness may be generated by an external force.

SUMMARY

The present disclosure has been made in view of the above problems, and it is an object of the present disclosure to provide a display apparatus that may solve roughness and heat dissipation of a display panel.

In accordance with an aspect of the present disclosure, the above and other objects can be accomplished by the provision of a display apparatus comprising a display panel including a first display portion and a second display portion bent from the first display portion; a support plate coupled to a rear surface of the first display portion; and a housing for receiving the support plate, coupled with a rear surface of the second display portion.

BRIEF DESCRIPTION

The above and other objects, features and other advantages of the present disclosure will be more clearly understood from the following detailed description taken in conjunction with the accompanying drawings, in which.

DETAILED DESCRIPTION

Figure 1:
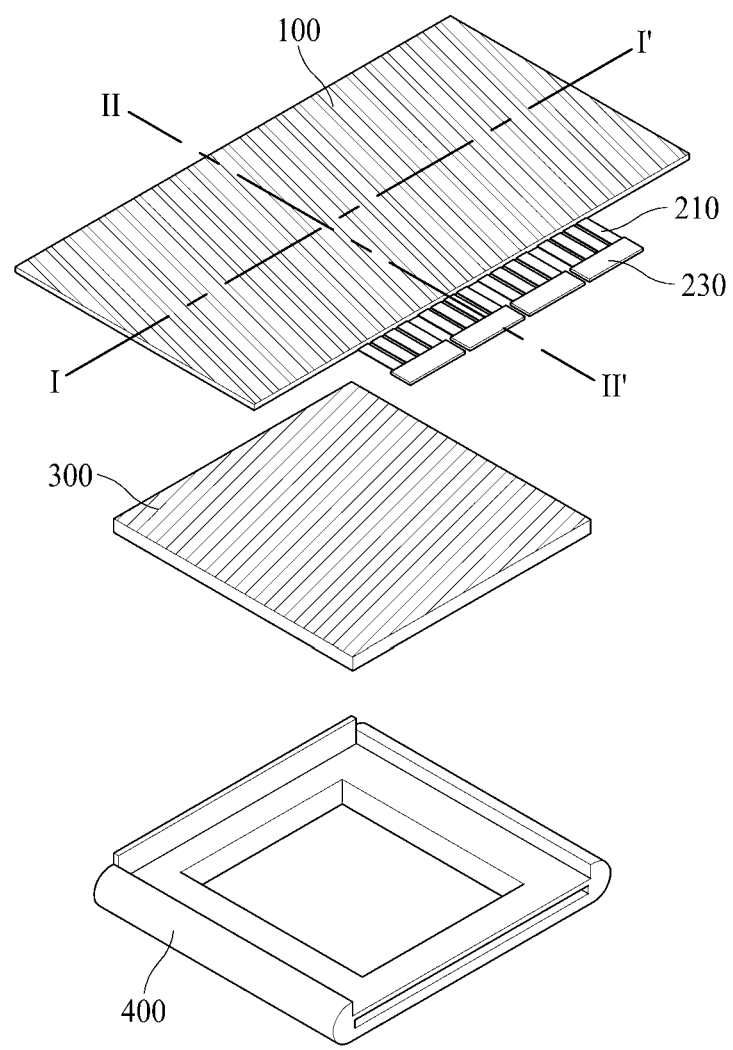
FIG. 1 is an exploded perspective view illustrating a display apparatus according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

"A first horizontal-axis direction", "a second horizontal-axis direction" and "a vertical-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the embodiments of the present disclosure of a multi-film and an organic light emitting display device according to the present disclosure will be described in detail with reference to the accompanying drawings. Wherever possible, the same reference numbers will be used throughout the drawings to refer to the same or like parts.

Figure 2:
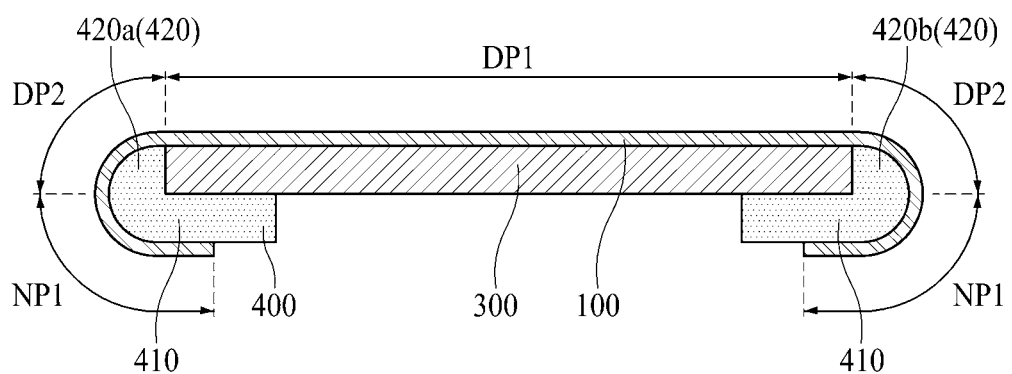
FIG. 2 is a cross-sectional view taken along line I-I' illustrating a coupling state of a display apparatus according to the first embodiment of the present disclosure.
Figure 3:
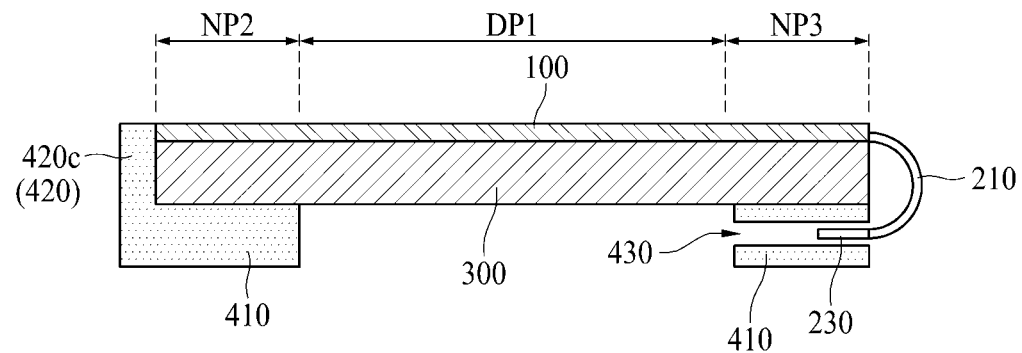
FIG. 3 is a cross-sectional view taken along line II-II' illustrating a coupling state of a display apparatus according to the first embodiment of the present disclosure.
Figure 4:
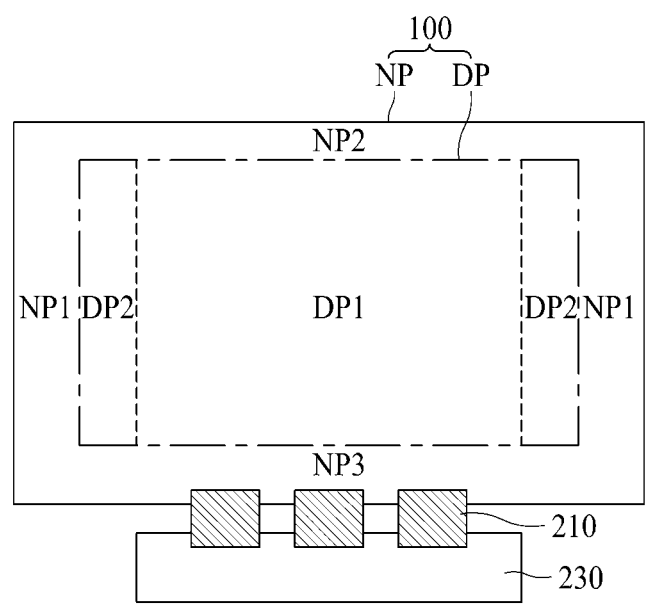
FIG. 4 is a plane view illustrating a display panel and a circuit board according to an embodiment of the present disclosure.

FIG. 1 is an exploded perspective view illustrating a display apparatus according to an embodiment of the present disclosure. FIG. 2 is a cross-sectional view taken along line I-I' illustrating a coupling state of a display apparatus according to the first embodiment of the present disclosure. FIG. 3 is a cross-sectional view taken along line II-II' illustrating a coupling state of a display apparatus according to the first embodiment of the present disclosure. FIG. 4 is a plane view illustrating a display panel and a circuit board according to an embodiment of the present disclosure.

Referring to FIGS. 1 to 4, the display apparatus according to the first embodiment of the present disclosure includes a display panel 100, a flexible film 210, a circuit board 230, a support plate 300, and a housing 400.

The display panel 100 displays an image, and may be realized as all types of display panels such as a liquid crystal display panel, an organic light emitting diode (OLED) display panel, and an electroluminescent display panel. The display panel 100 includes a display portion DP and a non-display portion NP.

The display portion DP is an area for displaying an image, and may be defined at a middle portion of the display panel 100. The display portion DP includes a first display portion DP1 and a second display portion DP2 bent from the first display portion DP1.

The first display portion DP1 is an area for displaying an image on a front surface of the display panel 100, and may be defined as a front display portion.

The second display portion DP2 is an area for displaying an image at a side of the display panel 100, and may be defined as an edge portion. For instance, the second display portion DP2 is provided at two opposite edges of the display portion DP along a first horizontal axis direction or a second different horizontal axis direction and displays an image. The second display portion DP2 may be bent from the first display portion DP1 and rounded to have a certain curvature radius. At this time, a width of the second display portion DP2 may be set based on a curvature radius during the bending process.

The non-display portion NP is an area where an image is not displayed, and may be defined at an edge portion of the display panel 100 to surround the display portion DP. The non-display portion NP includes a first non-display portion NP1, a second non-display portion NP2, and a third non-display portion NP3.

The first non-display portion NP1 is an area arranged at left and right edges of the display panel 100 as viewed with respect to the front display portion and bent with the second display portion DP2. The first non-display portion NP1 may include a gate driver. At this time, the gate driver may be formed in a GIP (Gate In Panel) method.

The second non-display portion NP2 is arranged at an upper edge of the display panel 100 as viewed with respect to the front display portion.

The third non-display portion NP3 is an area arranged at one edge of the display panel 100, specifically an area arranged at a lower edge as viewed with respect to the front display portion, and includes a pad portion connected with the circuit board 230. The pad portion may include a plurality of pads for delivering a signal to the thin film transistor provided in the display portion DP.

The flexible film 210 is provided to overlap some area of the third non-display portion NP3 to connect the pad portion provided in the third non-display portion NP3 with the circuit board 230. Lines which connect the pad portion with a source drive integrated circuit and lines which connect the pad portion with lines of the circuit board 230 may be formed in the flexible film 210. The flexible film 210 is attached to the plurality of pads by an anisotropic conducting film, whereby the plurality of pads may be connected with the lines of the flexible film 210.

The circuit board 230 is provided to be spaced apart from the third non-display portion NP3 and connected with the flexible film 210. The circuit board 230 may include a plurality of circuits realized as driving chips for transferring a driving signal to the display panel 100. For example, a timing controller may be packaged in the circuit board 230. The circuit board 230 may be a printed circuit board or a flexible printed circuit board.

The support plate 300 is arranged on a rear surface of the display panel 100. In detail, the support plate 300 may be coupled to a rear surface of the first display portion DP1. The support plate 300 may be arranged on the rear surface of the display panel 100, and may fix and support the display panel 100. The support plate 300 may be a metal sheet or metal plate made of a metal material, or may be made of a tempered glass material.

Since the support plate 300 may fix the display panel 100, a rough shape may be prevented from being exposed to the surface due to a thin structure of the display panel 100. Since the support plate 300 may prevent roughness from being generated on the surface of the display panel 100, picture quality of an image may be prevented from being deteriorated.

The support plate 300 is attached to the display panel 100 by an adhesive member. The adhesive member may be a thermal hardening adhesive or a natural hardening adhesive. For example, the adhesive member may be made of a material such as a pressure sensitive adhesive or a barrier pressure sensitive adhesive having a moisture absorption function.

Since the support plate 300 may be made of a metal material or tempered glass material to evenly support the display panel 100, a lamination process property may be obtained. Since the support plate 300 may be made of a metal material and the material made of a metal material has an excellent heat dissipation effect, the heat generated from a light emitting diode of the display panel is likely to be exhausted to the outside through the support plate 300.

The housing 400 is arranged on a rear surface of the support plate 300. The housing 400 may be arranged on the rear surface of the support plate 300 to receive the support plate 300. The housing 400 may receive the support plate 300, and may be coupled with the rear surface of the second display portion DP2 and the first non-display portion NP1. That is, a portion of the housing 400 may receive the support plate 300 coupled to the rear surface of the first display portion DP1, and the other portion of the housing 400 may be coupled with the rear surface of the second display portion DP2 and the rear surface of the first display portion NP1 to support the display panel 100. The housing 400 may be made of a plastic easy to be processed or a metal material. The housing 400 may be made of a metal or plastic material, of which deformation rate by heat is minimized, to support the display panel 100.

The housing 400 is attached to the display panel 100 and the support plate 300 by the adhesive member. The adhesive member may be a thermal hardening adhesive or a natural hardening adhesive. For example, the adhesive member may be made of a material such as a pressure sensitive adhesive or a barrier pressure sensitive adhesive having a moisture absorption function.

The housing 400 includes a rear frame 410 and a housing sidewall 420.

The rear frame 410 is arranged on the rear surface of the support plate 300 to support a rear edge of the support plate 300. The rear frame 410 is a portion for supporting the support plate 300, and may be defined as a bottom of the housing 400. The rear frame 410 may be formed in a structure for supporting the rear edge not the entire rear portion of the support plate 300. That is, the rear frame 410 may be formed in the form of a picture frame having a hole (or an opening) at the center.

The housing sidewall 420 is provided at the three edges except one edge of the rear frame 410, and may be formed to surround the side of the support plate 300. The housing sidewall 420 includes a first housing sidewall 420a, a second housing sidewall 420b, and a third housing sidewall 420c.

The first and second housing sidewalls 420a and 420b are provided at left and right edges of the housing 400. The first and second housing sidewalls 420a and 420b may be provided in parallel by interposing the support plate 300 there-between. The first and second housing sidewalls 420a and 420b may be provided at portion overlapped with the second display portion DP2 of the display panel 100 to support the second display portion DP2. Since the first and second housing sidewalls 420a and 420b may be formed in a rounding structure having a certain curvature radius in the same manner as the second display portion DP2, the first and second housing sidewalls 420a and 420b may support the second display portion DP2.

The third housing sidewall 420c is provided at an upper edge of the housing 400. The third housing sidewall 420c may be formed to surround the corresponding side of the display panel 100. The third housing sidewall 420c may be formed to adjoin the second non-display portion NP2 of the display panel 100, thereby supporting the side of the display panel 100. The third housing sidewall 420c may support the side of the display panel 100 to avoid movement of the display panel 100 and guide the display panel 100.

Since the housing 400 has a frame structure in the form of a picture frame, a lightweight frame may be obtained. If the housing 400 is formed in a flat panel structure with a filled center portion, a weight is increased, whereby problems such as the deformation of the frame during process may occur. In the display apparatus according to the present disclosure, since the housing 400 is configured in the form of a picture frame having a hole at the center, the lightweight display apparatus may be obtained, whereby productivity of the display apparatus may be obtained.

The housing 400 may support the support plate 300 and the display panel 100 through the rear frame 410 and the housing sidewall 420. At this time, since the second display portion DP2 of the display panel 100 is rounded to have a certain curvature radius, the first and second housing sidewalls 420a and 420b for supporting the second display portion DP2 may be rounded to have a certain curvature radius. As described above, since the housing 400 may completely fix the display panel through the first and second housing sidewalls 420a and 420b rounded to have the same curvature radius as that of the second display portion DP2, roughness may be prevented from being generated on the surface of the display panel 100 due to a thin structure, whereby picture quality of the image may be prevented from being deteriorated.

The display panel 100 according to the present disclosure may be formed in a bending structure in which the display panel 100 is bent at 180°. At this time, the first non-display portion NP1 may be bent at 180° and coupled to the rear frame 410. In this way, since the housing 400 may guide a curved surface of the display panel 100 that may be bent at 180°, the housing 400 may completely fix the display panel 100.

The housing 400 according to one embodiment may include a receiving portion 430.

The receiving portion 430 is provided at one edge of the rear frame 410, specifically the lower edge (i.e., the right edge in FIG. 3). The receiving portion 430 may be provided in the area overlapped with the third non-display portion NP3 of the display panel 100. The receiving portion 430 may receive the circuit board 230 connected with the pad portion provided in the third non-display portion NP3 through the flexible film 210. In this case, since a separate sidewall is not formed at the lower edge of the rear frame 410, the flexible film 210 may be rounded to have a certain curvature radius to receive the circuit board 230 in the receiving portion 430. In detail, the flexible film 210 may have a rounding structure having a certain curvature radius, and in the coupling structure of the display apparatus according to the present disclosure, the flexible film 210 may be rounded in a direction of the rear frame 410 disposed on the display panel 100 to insert the circuit board 230 into the receiving portion 430.

In the display apparatus according to the present disclosure, since a separate receiving portion 430 may be provided to receive the circuit board 230, a separate protective film for protecting the circuit board 230 from the outside may not be formed, whereby the process is favorable. The size of the display apparatus may be reduced as compared with the structure that the circuit board 230 is exposed to the outside, or the size of the display area for displaying an image may be obtained as much as the size of the circuit board.

Figure 5:
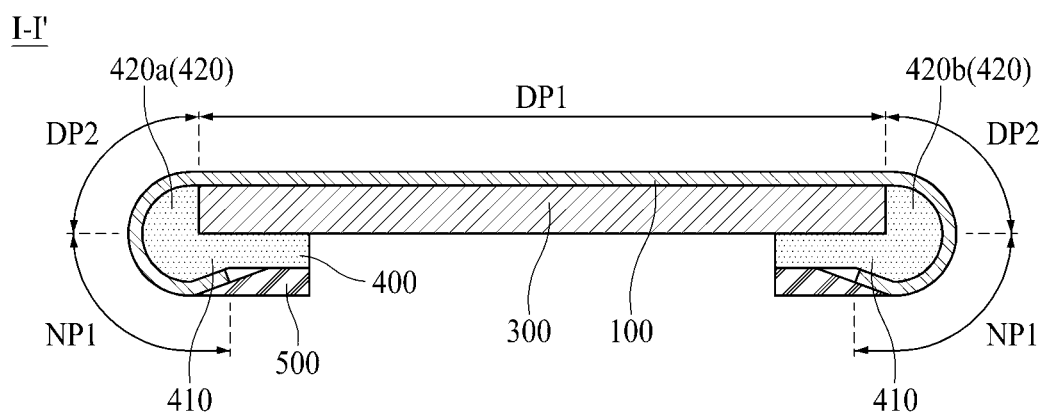
FIG. 5 is a cross-sectional view taken along line I-I' illustrating a coupling state of a display apparatus according to the second embodiment of the present disclosure.

FIG. 5 is a cross-sectional view taken along line I-I' illustrating a coupling state of a display apparatus according to the second embodiment of the present disclosure. The display apparatus according to the second embodiment of the present disclosure further includes a fixing member in the display apparatus according to the first embodiment. Hereinafter, a description repeated with FIGS. 1 to 4 will be omitted and description will be given based on elements different from those of FIGS. 1 to 4.

Referring to FIG. 5, the display apparatus according to the second embodiment of the present disclosure includes a fixing member 500 provided on left and right rear surfaces of the housing 400.

The fixing member 500 is arranged on the rear surface of the housing 400 and supports the rear frame 410. In detail, the fixing member 500 is arranged on the rear surface of left and right edges of the rear frame 410 on which the first and second housing sidewalls 420a and 420b are formed. The fixing member 500 may be made of a plastic or metal material, which is easy to be processed.

The fixing member 500 may fix the display panel 100 together with the rear frame 410. The fixing member 500 may fix one edge of the non-display portion NP, specifically the edge of the first non-display portion NP1. The edge of the first non-display portion NP1 may be arranged between the rear frame 410 and the fixing member 500 and then fixed. In this case, the fixing member 500 may be formed in a presser foot (or, pusher) structure for mechanically fixing the edge of the first non-display portion NP1. That is, since the fixing member 500 may fix the edge of the first non-display portion NP1 by pressing (or, holding-down) the edge of the first non-display portion NP1, coupling between the display panel 100 and the rear frame 410 may not be decoupled.

The fixing member 500 may completely fix the bending area of the display panel 100. Since the display panel 100 according to the present disclosure may be formed in a bending structure of 180°, a returning force of the bent portion may act on the portion bent at 180° by the spring back phenomenon. In this case, since the fixing member 500 fix the first non-display portion NP1 corresponding to an end of the bending area of the display panel 100, the 180° bending condition of the display panel 100 may be maintained.

The fixing member 500 is attached to the housing 400 by an adhesive member. The adhesive member may be a thermal hardening adhesive or a natural hardening adhesive. For example, the adhesive member may be made of a material such as a pressure sensitive adhesive or a barrier pressure sensitive adhesive having a moisture absorption function.

Figure 6:
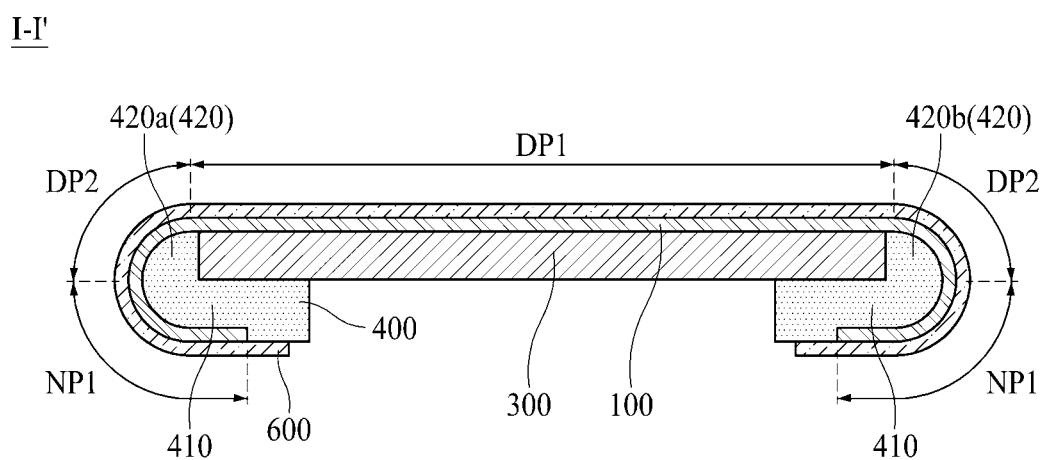
FIG. 6 is a cross-sectional view taken along line I-I' illustrating a coupling state of a display apparatus according to the third embodiment of the present disclosure.

FIG. 6 is a cross-sectional view taken along line I-I' illustrating a coupling state of a display apparatus according to the third embodiment of the present disclosure. The display apparatus according to the third embodiment of the present disclosure further includes a light transmittance film in the display apparatus according to the first embodiment. Hereinafter, a description repeated with FIGS. 1 to 4 will be omitted and description will be given based on elements different from those of FIGS. 1 to 4.

Referring to FIG. 6, the display apparatus according to the third embodiment of the present disclosure includes a light transmittance film 600 provided on an entire surface of the display panel 100.

The light transmittance film 600 is attached to the entire surface of the display panel 100 by a transparent adhesive layer. The light transmittance film 600 may be made of a flexible film, for example, at least one of a polyethylene terephthalate film, anti-reflection film, a polarizing film and a transmittance controllable film. The transparent adhesive layer may be an optically clear resin (OCR) or an optically clear adhesive (OCA).

The light transmittance film 600 may be extended longer than the display panel 100 and then attached to the rear surface of the housing 400. The light transmittance film 600 may be provided to surround the entire surface of the display panel 100, and since its both ends may be attached to the rear surface of the housing 400, the display panel 100 may be fixed completely. Since the display panel 100 according to the present disclosure may be formed in a bending structure of 180°, a returning force of the bent portion may act on the portion bent at 180° by the spring back characteristics. In this case, since the light transmittance film 600 is more extended than the first non-display portion NP1 corresponding to an end of the bending area of the display panel 100 and then attached to the rear surface of the housing 400, fixation of the display panel 100 provided between the light transmittance film 600 and the housing 400 may be enhanced, and the 180° bending condition of the display panel 100 may be maintained.

Figure 7:
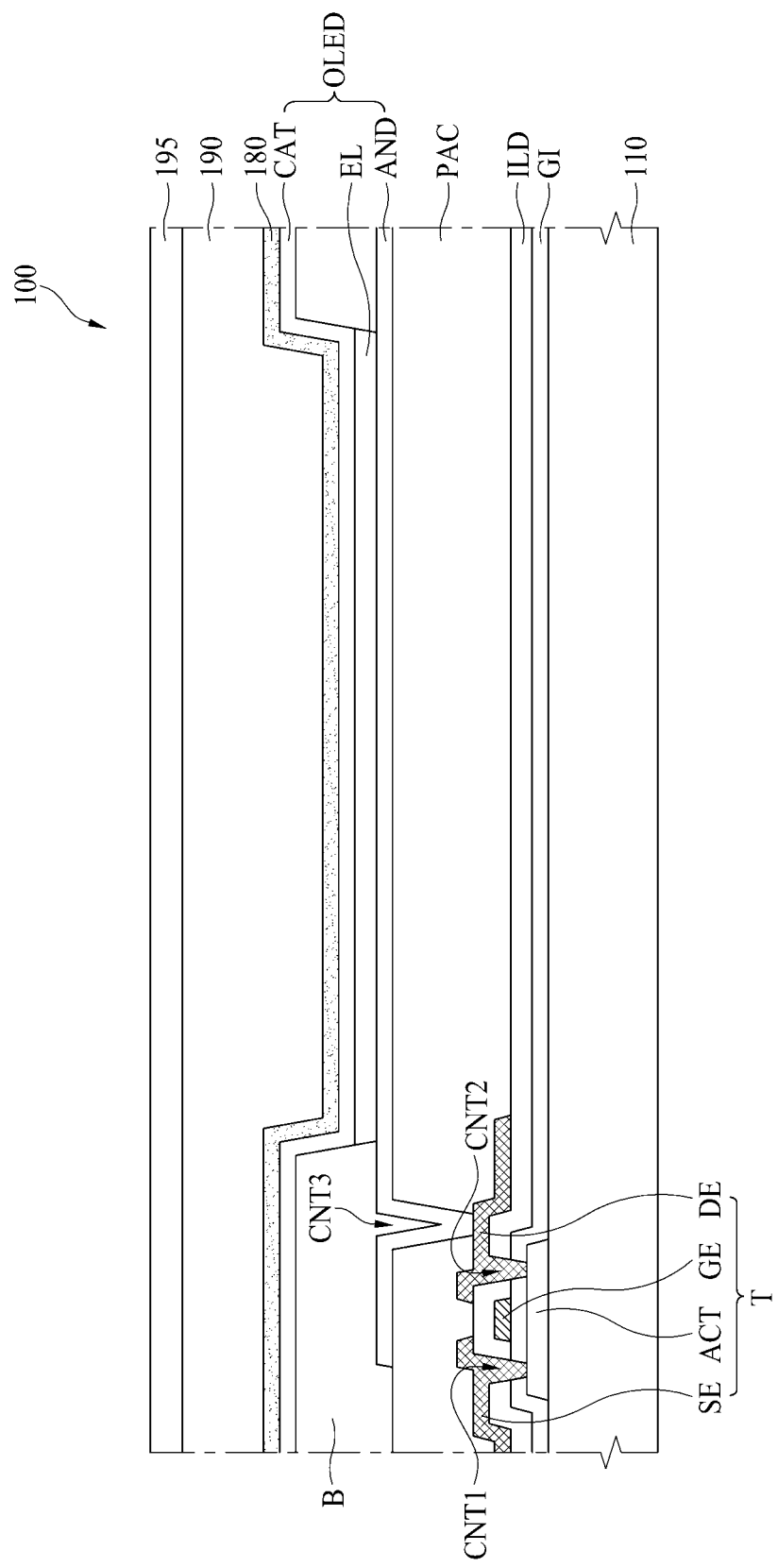
FIG. 7 is a cross-sectional view illustrating a display panel according to an embodiment of the present disclosure.

FIG. 7 is a cross-sectional view illustrating a display panel according to an embodiment of the present disclosure.

Referring to FIG. 7, the display panel 100 according to one embodiment of the present disclosure includes a base substrate 110, a thin film transistor T, a planarization layer PAC, an organic light emitting diode OLED, a passivation film 180, a filling material 190, and a facing substrate 195.

The base substrate 110 may be a glass substrate or a flexible plastic film. For example, the base substrate 110 may be, but not limited to, a sheet or film that includes cellulose resin such as TAC (triacetyl cellulose) or DAC (diacetyl cellulose), COP (cyclic olefin polymer) such as norbornene derivatives, COC (cyclo olefin copolymer), acryl resin such as PMMA (poly(methylmethacrylate)), polyolefin such as PC (polycarbonate), PE (polyethylene) or PP (polypropylene), polyester such as PVA (polyvinyl alcohol), PES (poly ether sulfone), PEEK (polyetheretherketone), PEI (polyetherimide), PEN (polyethylenenaphthalate), and PET (polyethyleneterephthalate), PI (polyimide), PSF (polysulfone), or fluoride resin.

The buffer layer may additionally be provided on the base substrate 110. The buffer layer may be provided on the entire upper portion of the base substrate 110. The buffer layer serves to prevent water from being permeated into the display panel 100. The buffer layer may be made of, but not limited to, an inorganic insulating material, for example, $SiO_2$ (silicon dioxide), SiNx (silicon nitride), or a multi-layered film of $SiO_2$ and SiNx.

The thin film transistor T is arranged on the base substrate 110. The thin film transistor T includes an active layer ACT, a gate insulating film GI, a gate electrode GE, an inter-layer dielectric film ILD, a source electrode SE, and a drain electrode DE.

The active layer ACT is provided on the base substrate 110. The active layer ACT is arranged to overlap the gate electrode GE. The active layer ACT may include one end area disposed at the source electrode SE, the other end area disposed at the drain electrode DE, and a center area disposed between the one end area and the other end area. In this case, the center area may be made of a semiconductor material which is not doped with a dopant, and the one end area and the other end area may be made of a semiconductor material doped with a dopant.

The gate insulating film GI is provided on the active layer ACT. The gate insulating film GI serves to insulate the active layer ACT from the gate electrode GE. The gate insulating film GI is provided to cover the active layer ACT. The gate insulating film GI may be made of, but not limited to, an inorganic insulating material, for example, $SiO_2$ (silicon dioxide), SiNx (silicon nitride), or a multi-layered film of $SiO_2$ and SiNx.

The gate electrode GE is provided on the gate insulating film GI. The gate electrode GE is overlapped with the center area of the active layer ACT by interposing the gate insulating film GI there between. The gate electrode GE may be, but not limited to, a single layer or multi-layer comprised of any one of Mo, Al, Cr, Au, Ti, Ni, Nd and Cu or their alloy.

The inter-layer dielectric film ILD is provided on the gate electrode GE. The inter-layer dielectric film ILD serves to insulate the gate electrode GE from the source electrode SE or the drain electrode DE. The inter-layer dielectric film ILD may be made of, but not limited to, an inorganic insulating material, for example, $SiO_2$, SiNx, or a multi-layered film of $SiO_2$ and SiNx.

The source electrode SE and the drain electrode DE are arranged to be spaced apart from each other on the inter-layer dielectric film ILD. A first contact hole CNT1 for partially exposing the one end area of the active layer ACT and a second contact hole CNT2 for partially exposing the other end area of the active layer ACT are provided in the gate insulating film GI and the inter-layer dielectric film ILD. The source electrode SE is connected with the one end area of the active layer ACT through the first contact hole CNT1, and is connected with the other end area of the active layer ACT through the second contact hole CNT2.

The aforementioned thin film transistor T is not limited to the aforementioned example, and various modifications may be made in the thin film transistor by the known elements that may easily be carried out by the person with ordinary skill in the art.

The planarization layer PAC is provided on the source electrode SE and the drain electrode DE. The planarization layer PAC serves to protect the thin film transistor T and planarize the upper portion of the base substrate 110 provided with the thin film transistor T. The planarization layer PAC may be made of, but not limited to, an organic insulating material such as acrylic resin, epoxy resin, phenolic resin, polyamides resin, and polyimides resin.

An inorganic insulating film may additionally be provided between the planarization layer PAC and the thin film transistor T. The inorganic insulating film serves to protect the thin film transistor T. In this case, the inorganic insulating film may be made of the same inorganic insulating material as that of the gate insulating film GI, for example, but not limited to, SiO2, SiNx, or a multi-layered film of SiO2 and SiNx.

A third contact hole CNT3 for exposing the drain electrode DE of the thin film transistor T is provided in the planarization layer PAC. The drain electrode DE is electrically connected with the anode electrode AND of the organic light emitting diode OLED through the third contact hole CNT3.

The organic light emitting diode OLED is provided on the thin film transistor T. The organic light emitting diode OLED includes an anode electrode AND, an organic layer EL, and a cathode electrode CAT.

The anode electrode AND is connected to the drain electrode DE of the thin film transistor T through the third contact hole CNT3 provided in the planarization layer PAC. A bank B is provided between anode electrodes AND adjacent to each other, whereby the anode electrodes AND adjacent to each other may electrically be insulated from each other. The bank B may be made of, but not limited to, an organic insulating material such as polyimides resin, acrylic resin, and benzocyclobutene (BCB).

The organic layer EL is provided on the anode electrode AND. The organic layer EL may include a hole transporting layer, an organic light emitting layer, and an electron transporting layer. Moreover, the organic layer EL may further include at least one function layer for improving emission efficiency and/or lifespan of the light emitting layer.

The cathode electrode CAT is provided on the organic layer EL and the bank B. If a voltage is applied to the anode electrode AND and the cathode electrode CAT, holes and electrons are moved to the organic light emitting layer through the hole transporting layer and the electron transporting layer, respectively, and are combined with each other in the organic light emitting layer to emit light.

The passivation film 180 is provided on the organic light emitting diode OLED. The passivation film 180 is provided on the cathode electrode CAT. The passivation film 180 is provided to be in contact with the filling material 190. The passivation film 180 may be provided on the entire surface of the display area. The passivation film 180 protects the thin film transistor T and the organic light emitting diode OLED from external impact. Also, the passivation film 180 serves to prevent water from being permeated into the display panel 100.

The filling material 190 is provided on the passivation film 180. The filling material 190 is in contact with the passivation film 180. The filling material 190 protects the thin film transistor T and the organic light emitting diode OLED from external impact. Also, the filling material 190 serves to bond the base substrate 110 with the facing substrate 195.

The facing substrate 195 is provided on the organic light emitting diode OLED and the passivation film 180. The facing substrate 195 is provided on the entire surface. The facing substrate 195 may be an encapsulation substrate. The facing substrate 195 prevents water from being permeated into the display panel 100. Also, the facing substrate 195 serves to protect the organic light emitting diode OLED and the thin film transistor T provided in the display panel 100 from external impact.

Although not shown in figures, the support plate 300 may be provided on the facing substrate 195. As described above, since the support plate 300 may be made of a metal or tempered glass material, the support plate 300 has a structure harder than the display panel 100. Therefore, the support plate 300 may protect the display panel 100 by absorbing impact applied to the display panel 100.

In the display apparatus according to the present disclosure, a guider of the display panel 100 may be provided by being divided into the support plate 300 and the housing 400 without being formed in one flat panel and the housing 400 is provided in the form of a picture frame having a hole at the center, a lightweight guider may be obtained and its productivity may be obtained. Since the support plate 300 may support a plane area of the display panel 100 and the housing 400 may support a curved area of the display panel 100, the display panel may completely be fixed and roughness may be prevented from being generated on the surface of the display panel 100.

As described above, according to the present disclosure, the following effects and advantages may be obtained.

In the display apparatus according to the present disclosure, since the support plate is coupled to the rear surface of the display panel, a lamination process property may be obtained, roughness may be prevented from being generated, and the problem of heat dissipation may be solved.

In the display apparatus according to the present disclosure, the frame for bending of the display panel is realized in an assembly type of the support plate and the housing, the lightweight display apparatus may be realized, easiness in a later process may be obtained, and productivity may be obtained.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display apparatus comprising:
    a display panel including a first display portion and a second display portion bent from the first display portion;
    a support plate coupled to a rear surface of the first display portion; and
    a housing for receiving the support plate, the housing coupled with a rear surface of the second display portion, wherein the housing includes:
        a rear frame for supporting a rear edge of the support plate, the rear frame including four edges;
        a first housing sidewall, a second housing sidewall, and a third housing sidewall provided at three edges except one edge of the rear frame, the first housing wall, the second housing wall, and the third housing sidewall surrounding three sides of the support plate; and
        a receiving portion provided at the one edge of the rear frame.

2. The display apparatus according to claim 1, wherein the second display portion is rounded to have a predetermined curvature radius.

3. The display apparatus according to claim 1, wherein the first housing sidewall and the second housing sidewall are parallel with each other by interposing the support plate there between, the first housing sidewall and the second housing sidewall having a predetermined curvature radius.

4. The display apparatus according to claim 3, wherein the third housing sidewall surrounding one corresponding side surface of the display panel.

5. The display apparatus according to claim 1, further comprising:
    a circuit board in which a plurality of circuits are packaged, the circuit board connected with the display panel,
    wherein the circuit board is received in the receiving portion.

6. The display apparatus according to claim 5, further comprising:
    a non-display portion of the display panel surrounding the first display portion and the second display portion,
    wherein a pad portion is provided at one edge of the non-display portion, and the pad portion is connected with the circuit board through a flexible film.

7. The display apparatus according to claim 6, wherein the flexible film is rounded to have a predetermined curvature radius.

8. The display apparatus according to claim 6, further comprising:
    a fixing member for supporting the rear frame,
    wherein the one edge of the non-display portion is arranged between the rear frame and the fixing member and then fixed.

9. The display apparatus according to claim 1, further comprising:
    a light transmittance film provided on an entire surface of the display panel.

10. The display apparatus according to claim 9, wherein the light transmittance film is attached to a rear surface of the housing.

11. A display apparatus comprising:
    a flexible display panel including a first display portion and a second display portion having a viewing direction different from that of the first display portion;
    a rigid support member including at least a flat surface and being coupled to the first display portion with the flat surface; and
    a housing for supporting or coupling with the support member, the housing including:
        a rear frame for supporting a rear edge of the support member and including four edges;
        a first housing sidewall, a second housing sidewall, and a third housing sidewall provided at three edges except one edge of the rear frame surrounding three sides of the support member;
        a receiving portion provided at the one edge of the rear frame,
    wherein the second display portion is coupled with the housing or the support member.

12. The display apparatus according to claim 11, wherein the support member comprises a support plate.

13. The display apparatus according to claim 12, further comprising:
    a non-display portion of the display panel surrounding the display portion(s).

14. The display apparatus according to claim 13, further comprising:
    a circuit board, in which a plurality of circuits are packaged, connected with the display panel,
    a pad portion being provided at one edge of the non-display portion, and connected with the circuit board through a flexible film that is rounded to have a predetermined curvature radius.

15. The display apparatus according to claim 13, wherein the non-display portion extends from at least one edge of the display portion(s) to a corresponding edge or a rear surface of the housing, so as to be attached to the housing.

16. The display apparatus according to any one of claim 13, further comprising:
    a fixing member at a rear surface of the housing,
    wherein one edge of the non-display portion is arranged between the housing and the fixing member and is fixed to the housing by the fixing member.

17. The display apparatus according to claim 12, wherein the first housing sidewall and the second housing sidewall are parallel with each other by interposing the support plate there between, the first housing sidewall and the second housing sidewall having a predetermined curvature radius.

* * * * *